United States Patent [19]

Kamath et al.

[11] 4,235,651
[45] Nov. 25, 1980

[54] FABRICATION OF GAAS-GAALAS SOLAR CELLS

[75] Inventors: G. Sanjiv Kamath, Malibu; Carl L. Anderson, Pacific Palisades, both of Calif.

[73] Assignee: Hughes Aircraft Company, Culver City, Calif.

[21] Appl. No.: 21,732

[22] Filed: Mar. 19, 1979

Related U.S. Application Data

[62] Division of Ser. No. 792,839, May 2, 1977, Pat. No. 4,163,987.

[51] Int. Cl.$^3$ .......................................... H01L 21/208
[52] U.S. Cl. .................................. 148/171; 136/262; 148/1.5; 148/172
[58] Field of Search .................. 148/171, 172, 1.5; 136/89 GA; 357/30

[56] References Cited

U.S. PATENT DOCUMENTS

| | | | |
|---|---|---|---|
| 3,675,026 | 7/1972 | Woodall | 148/171 X |
| 3,931,631 | 1/1976 | Groves et al. | 357/17 |
| 3,994,755 | 11/1976 | Kamath et al. | 148/172 |
| 4,026,735 | 5/1977 | Kamath et al. | 148/171 |
| 4,051,061 | 9/1977 | Bhargava et al. | 148/172 |
| 4,126,930 | 11/1978 | Moon | 148/172 X |
| 4,163,987 | 8/1979 | Kamath et al. | 357/30 |

Primary Examiner—G. Ozaki
Attorney, Agent, or Firm—William J. Bethurum; W. H. MacAllister

[57] ABSTRACT

The specification describes an improved III-V compound solar cell structure and fabrication process therefor wherein a P-type layer of gallium aluminum arsenide is epitaxially grown on an N-type gallium arsenide substrate to form a P-type region and a PN junction in the substrate. Controlled amounts of beryllium are introduced into both the epitaxial layer and the substrate, either during epitaxial growth or by using beryllium ion implantation techniques subsequent to the P-type epitaxial growth step. The homojunction-heterostructure device thus formed exhibits improved power conversion efficiencies in excess of 17%.

7 Claims, 4 Drawing Figures

FABRICATION OF GAAS-GAALAS SOLAR CELLS

This is a division of application Ser. No. 792,839 filed May 2, 1977, now U.S. Pat. No. 4,163,987.

FIELD OF THE INVENTION

This invention relates generally to solar cells and related fabrication processes and more particularly to an improved III-V ternary compound solar cell structure which is doped with beryllium. This doping lowers the series resistance of the cells and thus insures improved power conversion efficiencies in excess of 17% for the resultant solar cells, even for wide variations in x in the compound $Ga_{1-x}Al_xAs$.

BACKGROUND AND RELATED APPLICATIONS

Substantial efforts have been made in recent years to increase the power conversion efficiency of both silicon and III-V compound solar cells. These efforts have established that gallium arsenide has potentially about a 4% power conversion efficiency advantage over silicon and further that this advantage is even greater when III-V ternary compounds are used together with gallium arsenide to form the solar cell. Of particular interest in this latter class of structures is a cell which includes a N-type gallium arsenide substrate upon which a P-type layer of gallium aluminum arsenide, $Ga_{1-x}Al_xAs$, is epitaxially grown to form a P-type region in the substrate and defining a PN junction therein. One structure of this general type is shown, for example, in an article entitled "From Photons to Kilowatts, Can Solar Technology Deliver?" by Joel duBow, *Electronics*, Vol. 49, No. 23, Nov. 11, 1976, at page 89.

Cells such as those shown in the above duBow article have been fabricated using infinite melt liquid phase epitaxial (LPE) techniques such as those disclosed, for example, in U.S. Pat. No. 3,994,755 of G. S. Kamath et al, issued Nov. 30, 1976, and in U.S. application Ser. No. 717,806 of G. S. Kamath et al, entitled "Method for Growing Thin Semiconducting Epitaxial Layers", filed Aug. 26, 1976, now U.S. Pat. No. 4,026,735, both assigned to the present assignee. The method of this latter copending application is referred to as the vertical graphite slide bar technique for epitaxial growth and utilizes an enclosable verticle graphite slide bar holder for supporting gallium arsenide substrates prior to and during epitaxial deposition. This holder serves to establish thermal and saturation equilibrium between the substrate and the infinite melt solution in which GaAs and $Ga_{1-x}Al_xAs$ epitaxial layers may be formed on GaAs substrates. All of the above-identified disclosures are incorporated fully herein by reference.

In order to minimize the resistivity of the P and N-type regions of the semiconductor structure and thus minimize the series resistance of regions of the above-described gallium aluminum arsenide gallium arsenide solar cells, P-type dopants such as zinc and germanium have previously been introduced into the P-type layers of the solar cell structure during epitaxial growth from solution. One such Zn doped solar cell is disclosed, for example, by H. J. Hovel et al in an article entitled "$Ga_{1-x}Al_xAs$-GaAs PPN Heterojunction Solar Cells", *Journal of the Electrochemical Society,* September 1973, pp. 1246-1252, incorporated herein by reference. These dopants serve to increase the carrier concentration and thus lower the bulk resistivity of the structure on the P side of the PN junction therein. While these particular P-type dopants, i.e., zinc and germanium, have proven generally satisfactory in fabrication of certain types of solar cells, both of these dopants also create certain disadvantages which have been eliminated by the present invention. That is, the element zinc has a high vapor pressure and an anomalous behavior as a diffusant in GaAs and as such poses control and stability problems in device processing. On the other hand, germanium has proven unsuitable for use as a P-type dopant with high aluminum concentrations in a $Ga_{1-x}Al_xAs$ P-type layer. That is, when x is greater than about 0.85 in $Ga_{1-x}Al_xAs$, germanium becomes a deep level impurity in the GaAs bandgap, thus reducing the number of ionized carriers available in the semiconductor and rendering it ineffective as a means of lowering the resistivity on the P side of the PN-junction of the solar cell structure. The result, of course, is an increase in forward resistance in the cell, and this causes heating in the cell and results in power losses during solar cell operation. Additionally, for values of x greater than 0.85 in $Ga_{1-x}Al_xAs$, the carrier concentration due to germanium is less than $10^{16}$ atoms per cubic centimeter range at maximum germanium solubility.

THE INVENTION

We have discovered that III-V ternary compound solar cells with improved power conversion efficiencies and without the above disadvantages associated with Ge and Zn dopants can be fabricated when beryllium is used as a P-type diffusant and is introduced into the solar cell structure in controlled amounts. This Be doping may be done either during liquid epitaxial solution growth to form the P-N junction of the solar cell or subsequently in a separate ion implantation doping step. In reducing our invention and discovery to practice, we initially provided a saturated solution of gallium aluminum arsenide in chosen amounts of gallium and aluminum and thereafter we introduced from between five and ten milligrams of beryllium into this solution for each 1,000 grams of gallium therein. Then, using the vertical graphite slide bar and LPE solution growth techniques described in our allowed copending application Ser. No. 717,806, we submerged an N-type gallium arsenide substrate into the beryllium-doped saturated solution of gallium aluminum arsenide in gallium and aluminum to expose one surface of the N-type gallium arsenide substrate to the solution for a chosen time and under controlled solution growth temperature conditions. In this step a P-type layer of gallium aluminum arsenide was epitaxially deposited on the N-type gallium arsenide substrate, and additionally, a region of controlled thickness beneath the deposited $Ga_{1-x}Al_xAs$ layer was converted to P-type conductivity to thus form a PN junction in the original gallium arsenide substrate material. Upon removal of the layered semiconductor structure from the above-identified infinite melt growth solution and upon the subsequent testing thereof, this solar cell structure was found to have a power conversion efficiency in excess of 17% for the III-V the ternary epitaxial layer $Ga_{1-x}Al_xAs$, where x was 0.95. However, in actual practice x may vary from 0 to 0.97 using the present process.

Accordingly, it is an object of the present invention to provide a new and improved III-V compound solar cell which exhibits improved power conversion efficiencies in excess of 17%.

Another object is to provide a new and improved III–V compound solar cell fabrication process in which improved P-type doping is accomplished using the dopant beryllium and using either liquid phase epitaxial growth techniques or ion implantation techniques for introducing beryllium into the solar cells being fabricated.

A further object of the present invention is to provide a new and improved III–V compound solar cell fabrication process which eliminates certain process control problems associated with high vapor pressure P-type dopants.

A still further object is to provide an improved solar cell fabrication process of the type described in which the cell resistivity is substantially independent of x in the solar cell layer $Ga_{1-x}Al_xAs$.

These and other objects and features of the invention will become more fully apparent in the following description of the accompanying drawings.

DRAWINGS

FIGS. 1–3 are schematic cross-section views illustrating the process steps embodying the invention.

FIG. 4 is an isometric view of the completed solar cell structure embodying the invention.

Figure 1:
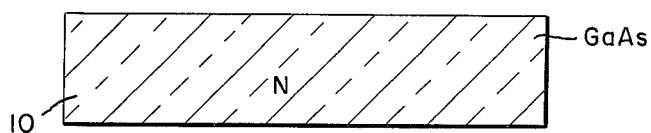
Referring now to FIG. 1, there is shown an N-type gallium arsenide substrate 10 which typically is doped initially with $5 \times 10^{16}$ atoms of tin(Sn) per cubic centimeter and the GaAs substrate 10 has a thickness in the range of 200–250 micrometers and a resistivity typically on the order of about $10^{-3}$ ohm cm. The N-type GaAs substrate 10 is inserted into a liquid phase epitaxial (LPE) deposition chamber (not shown) such as, for example, the one described in the Kamath et al U.S. Pat. No. 3,994,755 or the one described in the allowed copending Kamath et al application Ser. No. 717,806 now U.S. Pat. No. 4,026,735, identified above. Preferably, the vertical graphite slide bar techniques described in the above application Ser. No. 717,806 now U.S. Pat. No. 4,026,735, are utilized in the handling of the GaAs substrate 10 prior to epitaxial growth thereon in order to establish thermal and saturation equilibrium between the substrate 10 and a saturated infinite melt solution of gallium aluminum arsenide in gallium and aluminum, with 5–10 milligrams of beryllium added for each 1,000 grams of gallium.

The epitaxial growth solution (not shown) contains high purity gallium arsenide dissolved in a mixture of 99.9% (or greater) pure gallium and aluminum which has been doped with beryllium in the preparation of the growth matrix. However, the gallium:aluminum ratio in this solution can be adjusted to yield any desired percentage of aluminum in the ternary compound $Ga_{1-x}Al_x As$. Once a specific epitaxial growth solution is prepared, it is maintained in an ambient of palladium-diffused hydrogen gas, and this hydrogen gas is continually passed through the crystal growth chamber and over the solution (infinite melt) during the epitaxial growth runs. In the actual reduction to practice of the present process, we grew more than 300 layers of $gallium_{0.05}$, $aluminum_{0.95}$ arsenide on GaAs substrates and with reproducible properties. In these epitaxial structures, the dopant beryllium provides the advantageous properties of a very low activation energy (0.03 electron volts) and a low vapor pressure.

The epitaxial layer 12 is typically between 0.5 and 1 micrometer in thickness and exhibits a variation in thickness of less than ±10% over substrates larger than 1 square inch in area. A few epitaxial layers 12 having a thickness down to about 0.2 micrometers have been grown using the solution growth techniques described in the above-identified copending Kamath et al application Ser. No. 717,806, now U.S. Pat. No. 4,026,735.

During the epitaxial deposition of the P-type gallium aluminum arsenide layer 12 on the N-type gallium arsenide substrate 10, the P-type beryllium atoms diffuse into a portion of the GaAs substrate 10 to convert the region 13 thereof to P-type conductivity and thus form a PN junction 14, which is the main photovoltaic PN junction of the solar cell. The PN junction depth beneath the epitaxial layer-substrate interface is typically less than one micrometer, and the total PN junction area has been made as large as 4 square centimeters.

Figure 2:
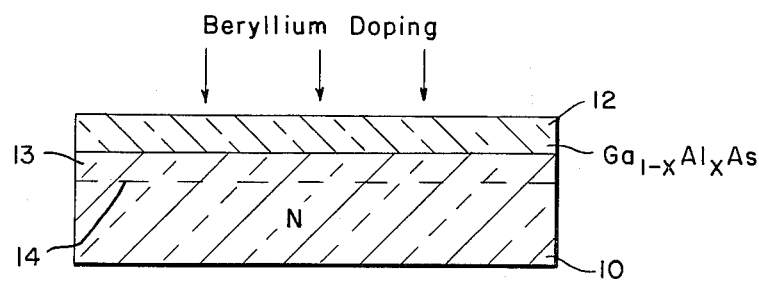

The solar cell structure in FIG. 2 is taken to a conventional state-of-the-art metal contact deposition station where an N type contact 16 of a gold-germanium-nickel alloy is deposited on the lower surface of the gallium arsenide substrate 10, and a P-type multifinger-like contact 18 of a gold-zinc-gold alloy is bonded as shown to the upper surface of the epitaxial layer 12. After metal evaporation, the top contacts 18 are sintered at a temperature of approximately 485° C.

Figure 3:
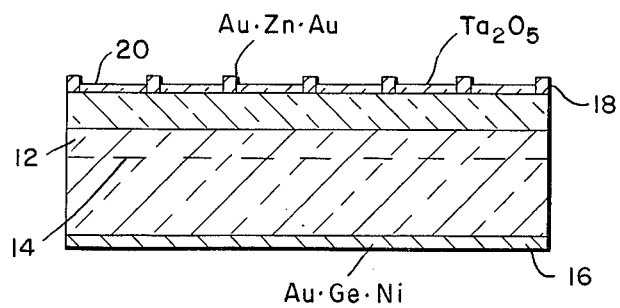

Conventional photoresist masking steps are used to provide the finger-like geometry of the top contacts 18 to thereby ensure the desired exposure of the solar cell to sunlight. Additionally, an anti-reflective (AR) coating 20 of tantalum oxide, $Ta_xO_5$, with an index of refraction of about 2.1 is deposited as shown on portions of the upper surface of the epitaxial layer 12 and between the finger-like electrical contact members 18. If desired, the solar cell structure of FIG. 3 may then be encapsulated in a thin quartz cover (not shown), and the tantalum oxide layer 20 will provide a good refractive index match between this quartz cover (not shown) and the gallium aluminum arsenide epitaxial layer 12. The quartz cover will normally include chosen amounts of magnesium fluoride, $MgF_2$, which is useful in reducing the reflection of light at the outer surface of the solar cell.

Figure 4:
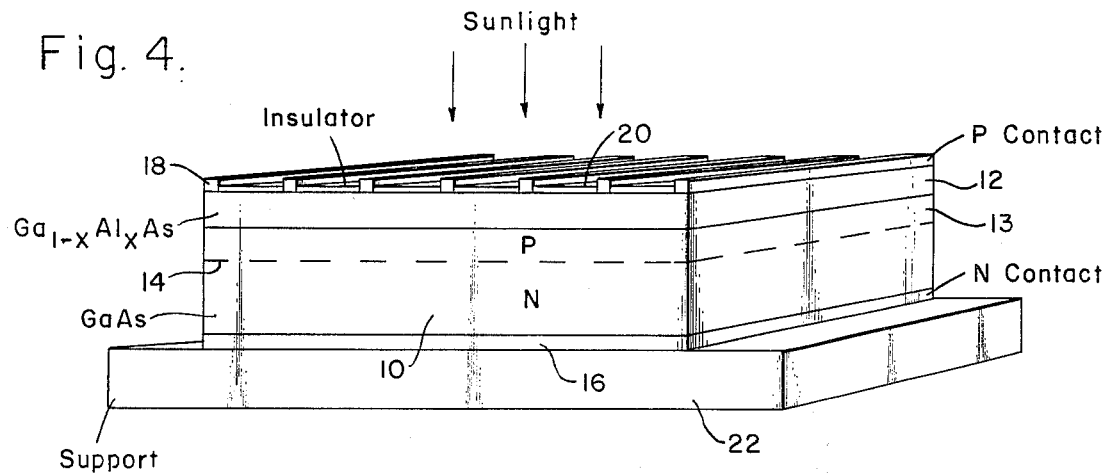

For cells four square centimeters in area which were actually constructed, the solar cell structures (illustrated in FIGS. 3 and 4) exhibited an air mass zero (AMO) efficiency in excess of 17%. Additionally, upon further testing and measuring of these cells, they were found to have a current density, $j_{sc}$, of 29.7 milliamperes per square centimeter and an open circuit voltage, $V_{oc}$, of approximately 1.00 volts. The corresponding AMO efficiency for these latter values was measured at about 17.5%.

Various modifications may be made in the above-described embodiment of our invention without departing from the true scope thereof. For example, the beryllium doping may be provided by ion implantation after the P-type epitaxial growth step instead of including beryllium in the epitaxial growth solution from which the gallium aluminum arsenide layer 12 is deposited. Additionally, the invention may be used for the fabrication of laser diodes or light-emitting diodes in order to lower the resistivity on both sides of PN junctions of these semiconductor devices. It will, therefore, be understood and appreciated that the present process is not strictly limited to the fabrication of III–V compound solar cell structures or to the beryllium doping thereof using only LPE techniques.

What is claimed is:

1. A process for fabricating a III–V compound solar cell having an improved power conversion efficiency, comprising:
   (a) providing a saturated epitaxial growth solution of gallium aluminum arsenide in gallium and aluminum at a predetermined solution growth temperature,
   (b) introducing beryllium atoms into said solution in a preselected amount sufficient to establish a desired P-type doping level in said solution, and
   (c) exposing an N-type gallium arsenide substrate to said solution for a predetermined time and under conditions of controlled liquid epitaxial growth temperature to form a P-type epitaxial layer of gallium aluminum arsenide on said gallium arsenide substrate and to convert a region of said substrate to P-type gallium arsenide, thereby defining a PN junction of said solar cell bounded by relatively low resistivity material which resistivity is substantially invariant with changes in the aluminum concentration in said solar cell.

2. The process defined in claim 1 wherein beryllium is introduced into said epitaxial growth solution in quantities from between 5 to 10 milligrams for every 1,000 grams of gallium in said solution.

3. The process defined in claim 1 wherein said epitaxial growth solution is initially maintained at a crystal growth temperature of about 750° C. or greater and is thereafter reduced at approximately 0.2° C. per minute for approximately five minutes in order to grow a P-type epitaxial layer of gallium aluminum arsenide on the order of about one micrometer in thickness.

4. The process defined in claim 3 wherein beryllium is introduced into said epitaxial growth solution in quantities from between 5 to 10 milligrams for every 1,000 grams of gallium in said solution.

5. A process for lowering the resistivity in a III–V compound semiconductor structure substantially independently of the aluminum concentration therein which comprises:
   (a) providing a substrate of N-type gallium arsenide,
   (b) forming an epitaxial layer of gallium aluminum arsenide on said substrate and of P-type conductivity to thereby convert a region of said substrate to P-type conductivity and form a PN junction therein, and either simultaneously or subsequently
   (c) introducing predetermined quantities of beryllium into said P-type epitaxial layer and said P-type region thereunder to reduce the resistivity on both sides of said PN junction and thus reduce resistive power losses in said structure.

6. The process defined in claim 5 wherein beryllium is introduced into said epitaxial growth solution in quantities from between 5 and 10 milligrams for every 1,000 grams of gallium in said solution.

7. The process defined in claim 6 wherein said epitaxial growth solution is initially maintained at a crystal growth temperature of about 750° C. or greater and is thereafter reduced at approximately 0.2° C. per minute for approximately five minutes in order to grow a P-type epitaxial layer of gallium aluminum arsenide on the order of about one micrometer in thickness.

* * * * *